United States Patent
Chang

(10) Patent No.: US 9,012,132 B2
(45) Date of Patent: Apr. 21, 2015

(54) COATING MATERIAL AND METHOD FOR PHOTOLITHOGRAPHY

(71) Applicant: Taiwan Semiconductor Manufacturing Company, Ltd., Hsin-Chu (TW)

(72) Inventor: Ching-Yu Chang, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 65 days.

(21) Appl. No.: 13/732,944

(22) Filed: Jan. 2, 2013

(65) Prior Publication Data
US 2014/0186773 A1 Jul. 3, 2014

(51) Int. Cl.
*G03F 7/20* (2006.01)
*H01L 21/02* (2006.01)

(52) U.S. Cl.
CPC ............ *G03F 7/20* (2013.01); *H01L 21/02109* (2013.01)

(58) Field of Classification Search
CPC ........... G03F 7/004; G03F 7/091; G03F 7/20; G03F 7/26
USPC .................................................. 430/322, 325
See application file for complete search history.

(56) References Cited

U.S. PATENT DOCUMENTS

| | | | |
|---|---|---|---|
| 6,420,085 B1 | 7/2002 | Nishi et al. | |
| 7,629,108 B2 | 12/2009 | Watanabe et al. | |
| 7,670,751 B2 | 3/2010 | Ohashi et al. | |
| 7,985,534 B2 | 7/2011 | Tsubaki | |
| 8,017,304 B2 | 9/2011 | Tarutani et al. | |
| 2006/0127804 A1* | 6/2006 | Jung et al. | 430/270.1 |
| 2007/0059849 A1 | 3/2007 | Op de Beeck | |
| 2007/0092843 A1 | 4/2007 | Yang | |
| 2008/0153036 A1 | 6/2008 | Suetsugu et al. | |
| 2009/0098490 A1 | 4/2009 | Pham et al. | |
| 2009/0133908 A1 | 5/2009 | Goodner et al. | |
| 2010/0143830 A1 | 6/2010 | Ohashi et al. | |
| 2010/0167213 A1* | 7/2010 | Seino et al. | 430/319 |
| 2010/0213580 A1 | 8/2010 | Meador et al. | |
| 2010/0304297 A1 | 12/2010 | Hatakeyama et al. | |
| 2011/0003247 A1 | 1/2011 | Ohashi et al. | |
| 2011/0003250 A1 | 1/2011 | Amara et al. | |
| 2011/0045413 A1 | 2/2011 | Tsubaki | |

OTHER PUBLICATIONS

Hiroto Yukawa; "TOK Resist Development Status for EUVL;" May 23, 2006; pp. 1-11; C/N: 1220605080; TOK Litho Forum; Tokyo Ohka Kogyo Co., Ltd.; Advanced Material Development Division 1; Vancouver, Canada.
Ching-Yu Chang; "Photosensitive Material and Method of Lithography;" U.S. Appl. No. 13/486,697, filed Jun. 1, 2012; 30 Pages.
Ching-Yu Chang; "Photosensitive Material and Method of Photolithography;" U.S. Appl. No. 13/437,674, filed Apr. 2, 2012; 21 Pages.

* cited by examiner

*Primary Examiner* — Brittany Raymond
(74) *Attorney, Agent, or Firm* — Haynes and Boone, LLP

(57) ABSTRACT

Provided is a method including providing a substrate and forming a bottom anti-reflective coating (BARC) on the substrate. The BARC includes a first portion overlying a second portion, which has a different composition than the first portion. The different composition may provide a different dissolution property of the BARC in a developer. A photoresist layer is formed on the first portion of the BARC. The photoresist layer is then irradiated and developed. The developing includes using a developer to remove a region of the photoresist layer and a region of the first and second portions of the BARC.

17 Claims, 6 Drawing Sheets

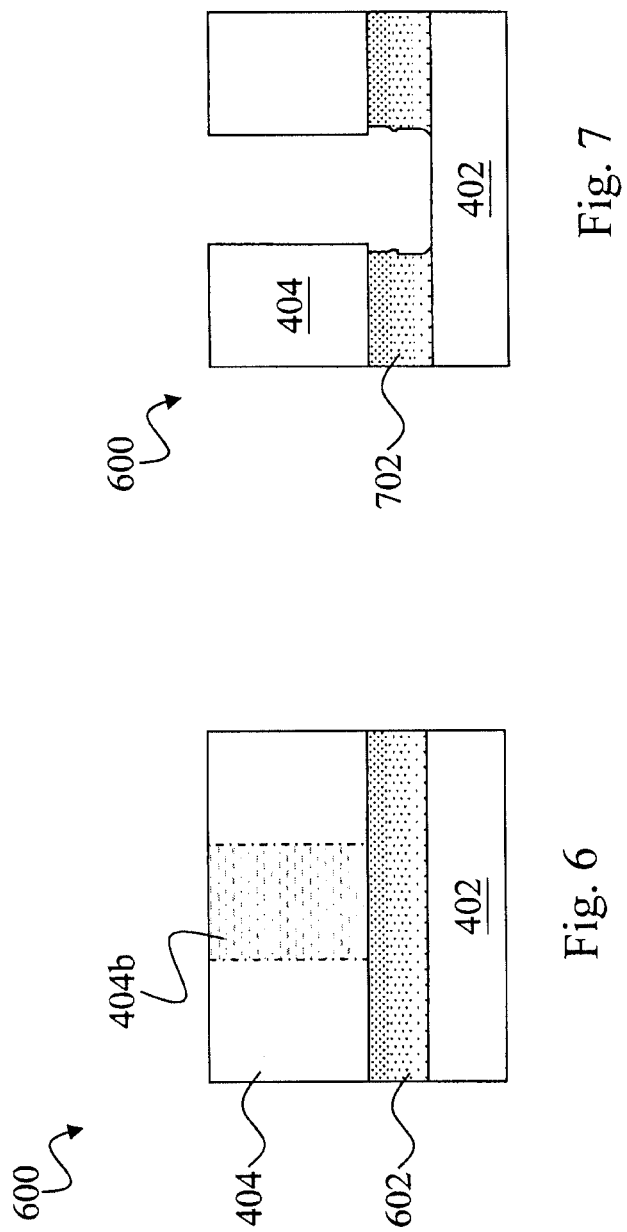

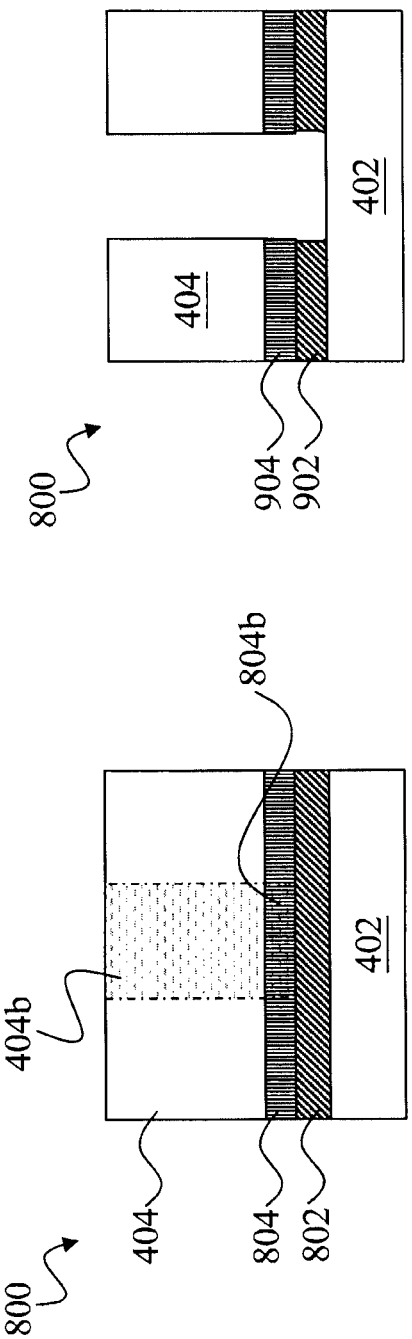

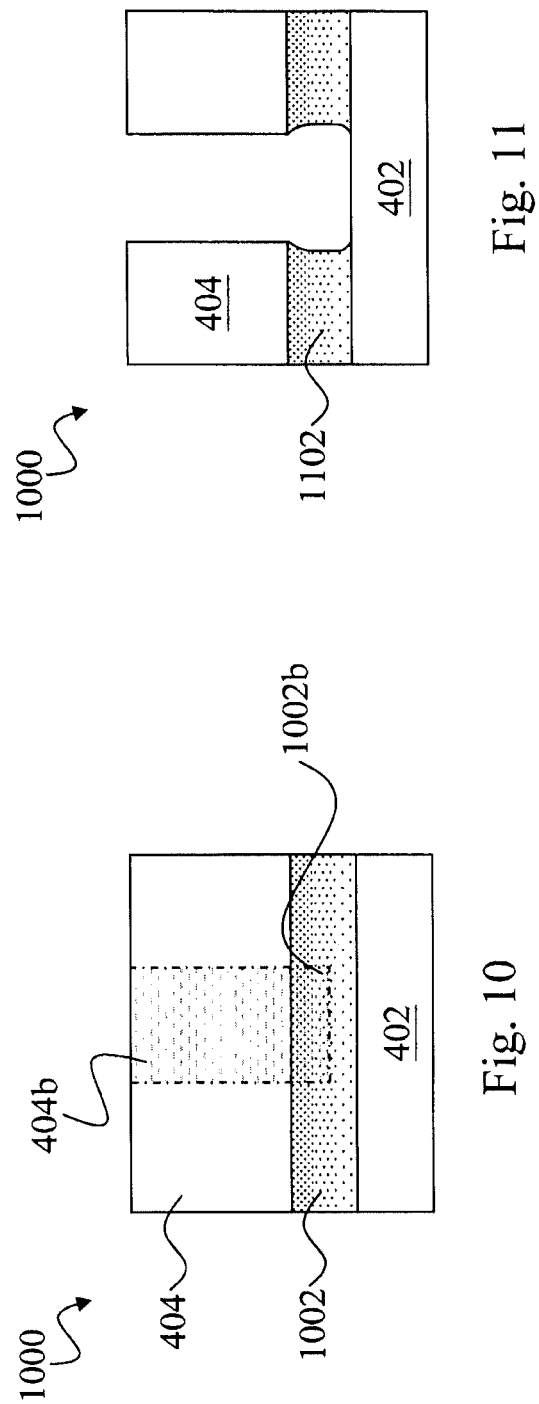

COATING MATERIAL AND METHOD FOR PHOTOLITHOGRAPHY

BACKGROUND

The semiconductor integrated circuit (IC) industry has experienced rapid growth. Technological advances in IC materials, design, and fabrication tools have produced generations of ICs where each generation has smaller and more complex circuits than the previous generation. In the course of these advances, fabrication methods and materials have been developed to realize the desire for smaller feature sizes.

Photoresists are photosensitive materials used to transfer images to a substrate. A coating layer of photoresist is positioned on the substrate and then exposed (or irradiated) through a photomask Proper photoresist processing is critical to development of smaller feature sizes. However, reflection of the radiation used to expose a photoresist can limit the resolution ability of a process. For example, reflection of radiation from a substrate/photoresist interface can produce variations in the intensity of the radiation in the photoresist and thus, its exposure. Therefore, the reflection can affect the line width upon development. The reflected radiation can also expose portions of the photoresist coating that were not intended to be irradiated, thus impacting the pattern fidelity. One approach used to reduce these reflections is providing antireflective coating compositions (or "ARCs") that can reduce the reflection of the radiation used to pattern an overlying photosensitive (also known as photoresist layer). The coating material can absorb the radiation.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 6-7 illustrate a second embodiment of a device according to aspects of the method 300.

FIGS. 8-9 illustrate a third embodiment of a device according to aspects of the method 300.

FIGS. 10-11 illustrate a fourth embodiment of a device according to aspects of the method 300.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. For example, though described herein as a photolithography method configured to fabricate semiconductor devices, any photolithography method or system may benefit from the disclosure including, for example, for TFT-LCD fabrication, and/or other photolithography processes known in the art. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Certain types of anti-reflective coatings or bottom-ARC (BARC) materials may be removed by dry etching in a separate step after an overlying photoresist layer has been patterned. However, recent trends have also introduced developer-soluble BARC materials that are also suitable for semiconductor processing and may be advantageous in decreasing the number of processing steps required. For example, the exposed resist and underlying developer-soluble BARC or DBARC, can be removed in the same step using a photoresist developer such as tetramethylammonium hydroxide (TMAH). Another type of BARC material is a photosensitive BARC, which provides for solubility changes to a developer based on irradiation of the material. For example, similar to negative or positive tone resist. However, DBARC and photosensitive BARC materials do not always provide the resolution desired.

Figure 2:
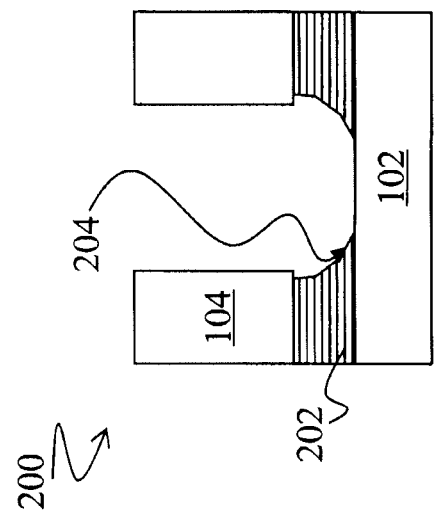
FIGS. 1 and 2 illustrated cross-sectional views of disadvantages of conventional photolithography materials and methods.
Figure 1:
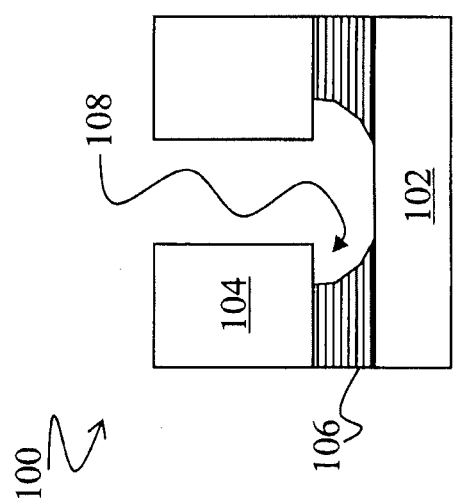

For example, FIGS. 1 and 2 illustrate devices and methods of use of BARC materials that provide an undesired profile. Semiconductor device 100 illustrates a substrate 102 having a conventional ARC 106, and an overlying photoresist layer 104. The conventional ARC 106 may be a developer-soluble BARC which when initially contacted by the developer will begin to dissolve. Since the dissolution is an isotropic etch removal of the developer-soluble BARC, the continuous etch by developer will move the laterally. This provides unwanted lateral ARC loss, such as illustrated by an undercut 108 of FIG. 1.

Similarly, semiconductor device 200 illustrates a substrate 102 having a conventional ARC 202, and an overlying photoresist layer 104. The conventional ARC 202 may be a photosensitive BARC. As described above, one type of photosensitive ARC is soluble to a developer only after exposure to radiation; without irradiation the material is insoluble. The anti-reflective coating materials however, including ARC 202, typically include a dye to provide additional radiation absorbance. Thus, the k value of the material provides for areas where sufficient radiation to provide the exposure and activation of the photoacid generators (PAG) does not reach the area. Thus, the weak radiation intensity at the ARC bottom inhibits the chemical amplify reaction (CAR) and provides a region of insolubility to the developer. This can provide residual, unwanted material which can affect pattern fidelity. For example, this unwanted residue is illustrated by a footing 204 of FIG. 2.

Thus, what is desired is a composition and method for bottom anti-reflective coatings, and in particular for bottom antireflective coating configurations that may provide an improved profile when removed (dissolved) by a developer.

Figure 3:
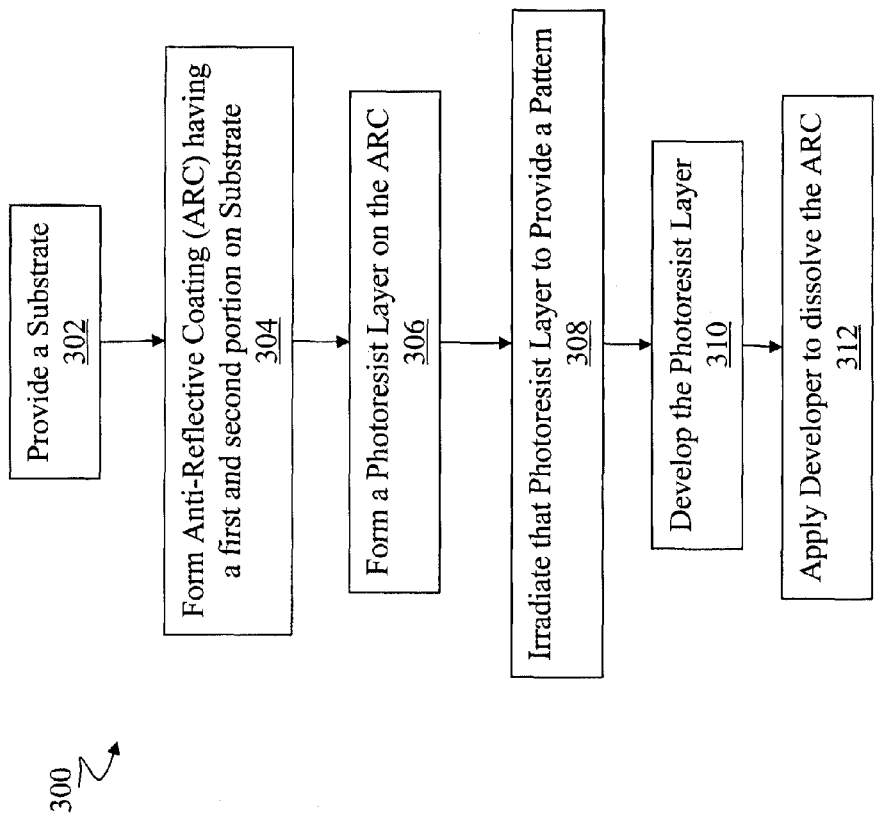
FIG. 3 illustrates a flow chart of an embodiment of a method of patterning a substrate according to one or more aspects of the present disclosure.

Illustrated in FIG. 3 is an embodiment of a method 300 of patterning a layer. FIGS. 4-11 are cross-sectional views of semiconductor devices 400, 600, 800, and 1000 that may be formed according to the method 300 of FIG. 3. These figures are described in further detail following the description of the method 300. It is noted however, that although descriptions of the present disclosure may discuss CMOS-process technology, semiconductor devices, processing a substrate in the form of a semiconductor wafer and the like, it is to be understood that other examples of substrates and processes may benefit from the present invention such as, for example, printed circuit board substrates, damascene processes, and thin film transistor liquid crystal display (TFT-LCD) substrates and processes.

The method 300 begins at block 302 where a substrate is provided. The substrate may be a semiconductor substrate (e.g., wafer). In an embodiment, the substrate is silicon in a crystalline structure. In alternative embodiments, the substrate may include other elementary semiconductors such as germanium, or includes a compound semiconductor such as, silicon carbide, III-V semiconductors such as gallium arsenide, indium arsenide, and indium phosphide. The substrate may include a silicon on insulator (SOI) substrate, be strained/stressed for performance enhancement, include epitaxially grown regions, include isolation regions, include doped regions, include one or more semiconductor devices or portions thereof, include one or more layers including conductive layers and insulating layers, and/or include other suitable features and layers. In an embodiment, the substrate is typical of a CMOS process technology. However, though processing a substrate in the form of a semiconductor wafer may be described, it is to be understood that other examples of substrates and processes may benefit from the present invention such as, for example, printed circuit board substrates, damascene processes, and thin film transistor liquid crystal display (TFT-LCD) substrates and processes.

The method 300 then proceeds to block 304 where a bottom anti-reflective coating (BARC) is formed on the substrate. The BARC may provide for absorption of radiation incident to the substrate during photolithography processes, including exposure of an overlying photoresist layer (as described below). In an embodiment, the BARC is a developer-soluble ARC (e.g., DBARC). The developer-soluble coating has a composition that is soluble in a developer solution, for example, the developer used to develop an overlying photoresist layer. In an embodiment, the BARC is a photosensitive BARC, also known as photoimageable BARC. A photosensitive BARC, or photoimageable BARC, is a composition that changes solubility to a developer solution upon exposure to radiation. In one type of photosensitive BARC, the material becomes soluble in developer upon irradiation (e.g., similar to positive tone resist). In another type of photosensitive BARC, the material becomes insoluble in developer upon irradiation (e.g., similar to negative tone resist).

The BARC formed on the substrate includes at least two portions, a first portion overlying a second portion. The portions may include different chemical compositions and/or properties. The portions may include different dissolution properties. For example, the first and second portions may have different dissolution rates in a developer. As another example, the first and second portions may be different types of BARC, e.g., photosensitive BARC and developer-soluble BARC. The portions of the BARC layers may be separately fabricated layers, or may be regions of a single layer having different compositions. In one embodiment, the first and second portions are not discrete but indicative of a changing or gradient composition through a single BARC layer.

As discussed above, the BARC may include any plurality of layers. The layers may include different dissolution properties (e.g., different dissolution rates, requiring exposure for dissolution or not, etc).

The semiconductor industry has developed several BARC compositions typically used in semiconductor processing including those provided by Nissan Chemical Industries, LTD (www.nissanchem.co.jp), Brewer Science (such as, ARC DS-K101 Developer-Soluble 248-nm BARC; ARC DS-A520 Photosensitive Developer-Soluble 193-nm BARC; www.brewerscience.com), and other suitable vendors. One or more of these compositions may be applied to the methods described herein.

The BARC formed in block 304 may be between approximately 60 nanometers (nm) and approximately 80 nm in thickness. For example, the BARC may include a first layer or portion being approximately 30 nm and a second layer or portion being approximately 30 nm. The BARC may be formed by one or more spin-on deposition processes that may be followed by one or more bake processes.

In an embodiment, a first portion of the BARC is a first layer having a first dissolution rate in a developer and the second portion of the BARC is a second layer having a second, different dissolution rate in the developer. In a further embodiment, the second layer underlies the first layer and has an increased dissolution rate in the developer. One example is described in FIG. 4.

For example, in an embodiment, a second portion of the BARC has a higher dissolution rate than that of the overlying first portion. In a further embodiment, the second portion has a dissolution rate more than approximately 1.1 times that of the first portion of BARC, by way of example and not intended to be limiting. In an embodiment, the BARC includes a DBARC composition, has functional groups that can define the polarity structure and that can increase the polymer solubility when contact to TMAH developer. For example, the polymer polarity group of the BARC (e.g., DARC) may contain hydroxyl group, lactone, carboxylic, epoxy, and/or other suitable materials. The BARC polymer may be selected from polyhydrostyrene (PHS), methacrylate, acrylate, naphthalene, and/or other suitable structure. The polymer may be selected such that the composition can meet the desired etch and/or reflectivity requirements. The BARC may also contain cross-linkers for solvent resistance achievement. For example, the cross linker may contain hydroxyl group for cross linking reaction. In an embodiment, the cross linker includes trialkyl amine. In a further embodiment, it may contain triethylamine.

In another embodiment, the BARC includes a first portion being a first layer of a photosensitive BARC material and a second portion being a second layer of a developer-soluble BARC (e.g., that does not require exposure for dissolution in a developer). The photosensitive BARC may include a photoacid generator (PAG). The photosensitive BARC, or photoimageable BARC, is a composition that changes solubility to a developer solution upon exposure to radiation. The first layer may overlie the second layer (e.g., the first layer share an interface with an overlying photoresist layer). One example is described in FIG. 8.

For example, the first portion of a photosensitive BARC may include a composition such as an acid sensitive functional group. The acid sensitive functional group can become developer-soluble after reaction with an acid. The acid in the BARC may come from the photo acid that is generated after exposure to a radiation beam. For example, in an embodiment the photo acid is PAG (photo acid generator). The PAG may be sensitive to KrF, ArF, EUV, Ebeam, and/or other suitable radiation. In an embodiment, the second portion of the BARC is DBARC and may include a functional group that has a polarity group, which can increase the polymer solubility when contacted with a developer such as TMAH. For example, the polymer polarity group may contain a hydroxyl group, lactone, carboxylic, epoxy and/or other suitable component. The DBARC polymer may selected from polyhydrostyrene (PHS), methacrylate, acrylate, naphthalene, and/or other suitable structure that can meet the desired etch and reflectivity requirement. The BARC may also contain cross linker for solvent resistance achievement. For example, the cross linker may contain hydroxyl group for cross linking reaction. The cross linker may be composed of trialkyl amine. For example, it may include triethylamine.

In yet another embodiment, the BARC is a single layer (e.g., deposited by a single deposition process (e.g., spin-on coating)). The single layer of BARC may provide for a separation into a first and second portion after the coating is applied to the substrate. The separation provides a different composition at an upper (e.g., first) portion of the layer than at a lower (e.g., second) portion of the layer due to movement of chemical components (e.g., polymers) of the coating, after the coating is deposited.

In an embodiment, the single layer of BARC includes at least two kinds of polymers. The upper portion of the layer may include a polymer that has a fluorine functional unit that helps the polymer to float to the upper portion of the layer during the single-layer BARC coating and baking processes. The fluorine functional unit may be or include a $-(CF_2)x-$ unit. In an embodiment, x ranges between approximately 1 and 10. Alternatively or additionally, the functional group may include at least one of $-CF_3$, $-C_2F_5$, $-C_3F_7$, and/or other suitable functional group that provides for achieving polymer floating ability.

The separation of components in the single layer BARC may provide a different dissolution rate at an upper or first portion of the single layer of BARC material than the lower or second portion of the layer. In an embodiment, a gradient in dissolution rate is provided from a top surface of the first portion to a bottom surface of the second portion.

For example, in an embodiment, one polymer of the BARC is a methacrylate polymer that includes a high polarity lactone group. When the BARC layer is formed, the upper portion of the layer may include a polymer with fewer lactone functional groups than that of the lower portion of the layer. In an embodiment, the upper portion of the BARC layer includes a polymer with approximately 20% lactone functional units. In a further embodiment, the lower portion of the BARC layer includes a polymer having approximately 30% lactone functional groups. The lactone functional group can open its ring and increase the polymer solubility to water and developer (e.g., TMAH) when in contact with a developer. The more lactone groups present, a greater dissolution rate can be achieved. In an embodiment, some other suitable functional groups may also be used, for example, to provide polarity switchability after contacting to a developer (e.g., TMAH). For example, some epoxy rings may also be opened in base solution.

Generally, the separation may be provided by a first chemical component, such as a polymer, "floating" to the upper portion of the layer. The floating may be induced by the chemical component (e.g., polymer) having a different polarity, containing an increased quantity or weight of fluorine atom(s) or a fluorine unit(s), having a different molecular weight (e.g., lower relative molecular weight), and/or other factors which provide a different affinity for the chemical components in the BARC material. One example is described in FIG. 6. Another example is described in FIG. 10.

In still another embodiment, the BARC is a single layer (e.g., deposited by a single deposition process (e.g., spin-on coating) as discussed above). The single layer of BARC may provide for a separation after coating. The separation includes providing a different composition at an upper (e.g., first) portion of the BARC than at a lower portion of the BARC layer due to movement of chemical components (e.g., polymers) after the coating is applied. Specifically, the first (e.g., upper) portion may provide a photosensitive BARC material, while the second (e.g., bottom) portion may be a developer-soluble composition (i.e., without irradiation required for solubility).

In an exemplary embodiment, a first component of the BARC is a methacrylate polymer that includes an acid labile group (ALG). This may separate to the upper portion of the layer. The upper portion of the polymer may then include more ALG groups than the lower portion of the BARC layer. When the photo acid generator (PAG) releases acid after exposure, the acid will cause the ALG to leave the polymer and thus the polymer will increase its dissolution rate in developing step. In one embodiment, the upper portion of the BARC layer includes a polymer having approximately 30% ALG. In an embodiment, the lower portion of the BARC layer has a polymer that includes approximately 40% of the ALG. The ALG may be an admantyl derivative or other tertiary alkyl group. The polymer of the BARC layer may also include other absorption functional groups, for example, to control the reflectivity. The absorption unit includes a conjugate bond for light absorption. For example, it may include a benzene structure for light absorption. In another embodiment, the BARC layer has a polymer that includes cross link functional groups or other hydrophilic structure for photoresist (PR) solvent resistance. For example, it may contain ester group (e.g., after a baking process such as coat baking). The inter polymer ester group may increase its resistance to solvent melting but can be decomposed again in developing step.

The separation of portions of the BARC may be provided by a first chemical component (e.g., polymer) floating to the upper portion of the layer. The first chemical component that floats to the upper portion of the layer may contain fluorine atom. For example, the upper portion may include a polymer having at least approximately 3% functional groups; these functional groups can help to make the polymer float to the upper region. In an embodiment, the lower portion of the polymer does not contain the fluorine structure. In one embodiment, the first portion of the polymer is methacrylate polymer. It may include approximately 30% ALG, approximately 8% fluorine functional groups, approximately 15% light absorption groups, approximately 37% polar groups, and approximately 10% cross link groups. The fluorine group may selected from $-CF_3$, $-C_2F_5$, other alkyl fluoride, and/or other suitable group. The light absorption group may include benzyl, phenol, alkyl benzyl structure and/or other suitable group. The polar group may include a hydroxyl, lactone, other carbon oxygen containing structure, and/or other suitable component. The cross link group may include methoxyl, ethoxyl, hydroxyl, other structure that can form an ester reaction or cross linking reaction with cross linker, and/or other suitable component.

The floating may be induced by the chemical component (e.g., polymer) having a different polarity, containing an increased quantity or weight of fluorine atom(s) or fluorine unit(s), having a different molecular weight (e.g., lower relative molecular weight), and/or other factors which provide a different affinity for the chemical component (e.g., polymer) in the BARC material. One example is described in FIG. 10.

After formation of the BARC, the method 300 then proceeds to block 306 where a photosensitive layer (e.g., photoresist) is formed on the substrate. The photoresist may be formed directly on the BARC having the first and second portions, as described above with reference to block 304. The photoresist may be positive-tone or negative-tone resist. In an embodiment, the photoresist is chemical amplified photoresist (CAR). The photoresist may include a polymer, a photo-acid generator (PAG), which provides the solubility change to the developer, a solvent, and/or other suitable compositions.

The photoresist may be formed by processes such as coating (e.g., spin-on coating) and soft baking.

The method 300 then proceeds to block 308 where the substrate is irradiated. The method may use various and/or varying wavelengths of radiation to expose the energy-sensitive photoresist layer, described above with reference to block 306. The irradiation may also expose some or all of the BARC described above with reference to block 304 (e.g., photosensitive BARC). In an embodiment, the substrate is irradiated using ultraviolet (UV) radiation or extreme ultraviolet (EUV) radiation. The radiation beam may additionally or alternatively include other radiation beams such as ion beam, x-ray, extreme ultraviolet, deep ultraviolet, and other proper radiation energy. Exemplary radiation is a 248 nm beam from a krypton fluoride (KrF) excimer laser, a 193 nm beam from an argon fluoride (ArF) excimer laser, and/or other suitable wavelength radiations. In an example, the photoresist and/or BARC include photo-acid generator (PAG) that generates acid during the exposure process thus changing the solubility of the exposed/non-exposed material. Lithography processes include immersion lithography, photolithography, optical lithography and/or other patterning methods which may transfer a pattern onto the photosensitive layer.

The method 300 may further include a post-exposure bake (PEB) process. During the baking process, the photoresist layer (and/or BARC layer) is provided at an elevated temperature. This may allow more acid to be generated from the photo-generated acids through a chemical amplification process.

The method 300 then proceeds to block 310 where the photoresist layer is developed. The developing may form a patterned photoresist layer including a plurality of masking elements or features. During the developing process, a developing solution is applied to the photoresist layer. In one embodiment, the photoresist material that was exposed to the radiation of block 308 is removed by the developing solution (developer). However, implementing a negative-tone resist is also possible. The developer or developing solution may be a positive tone developer or negative tone developer. One exemplary developer is aqueous tetramethylammonium hydroxide (TMAH).

The method 300 then proceeds to block 312 where the developer is used to dissolve the BARC material. In an embodiment, the developer is the same as that used to develop the photoresist. For example, the dissolution of the BARC material may be performed in-situ with the development of the photoresist layer.

The developer may dissolve uncovered regions of the BARC material such as those regions previously underlying the photoresist. Blocks 310 and 312 may occur substantially simultaneously. For example, after the developer removes the photoresist, the underlying BARC material is uncovered and thus, removed by the incident developer. The dissolution of the BARC material is described in further detail with respect to FIGS. 5, 7, 9, and 11, below. The dissolution of the BARC material provides a patterned BARC layer substantially similar to the overlying patterned photoresist layer. Thus, the patterned BARC layer may be used as a masking element for one or more subsequent processes.

The method 300 may proceed to rinsing, drying, and/or other suitable processes. The patterned photosensitive layer and/or patterned BARC layer may be used as a masking element in performing one or more processes on underlying layers such as etching, ion implantation, deposition, and/or other suitable processes including those typical of a CMOS-compatible process. The BARC layer may be stripped from the substrate and/or remain on the substrate for further processes.

Figure 5:
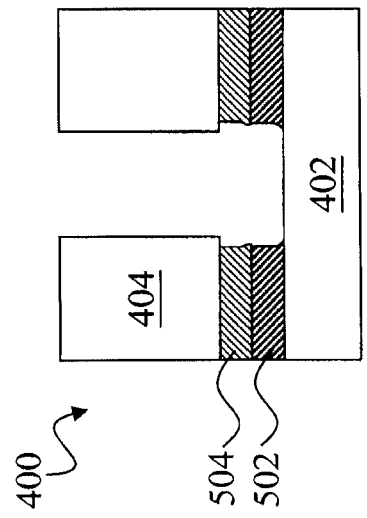
FIGS. 4-5 illustrate a first embodiment of a device according to aspects of the method 300.
Figure 4:
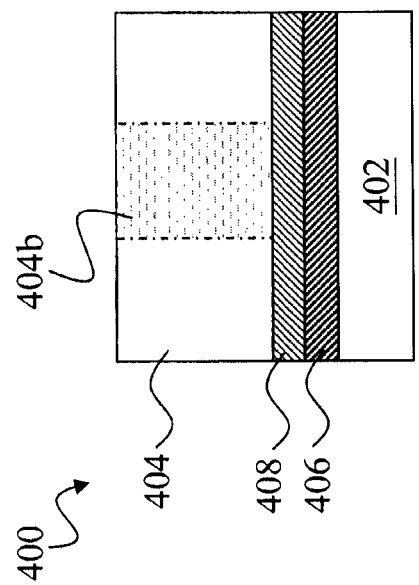

Referring now to the embodiments shown in FIGS. 4-5, illustrated is a device 400 having a substrate 402, a first bottom antireflective coating (BARC) 406, a second BARC layer 408, and an overlying photoresist layer 404. The substrate 402 may be a semiconductor substrate. In an embodiment, the substrate 402 is silicon in a crystalline structure. In alternative embodiments, the substrate 402 may include other elementary semiconductors such as germanium, or includes a compound semiconductor such as, silicon carbide, gallium arsenide, indium arsenide, and indium phosphide. The substrate 402 may include a silicon on insulator (SOI) substrate, be strained/stressed for performance enhancement, include epitaxially grown regions, include isolation regions, include doped regions, include one or more semiconductor devices or portions thereof, and/or include other suitable features and layers. In an embodiment, the substrate 402 is typical of a CMOS process technology. However, though processing a substrate in the form of a semiconductor wafer may be described, it is to be understood that other examples of substrates and processes may benefit from the present invention such as, for example, printed circuit board substrates, damascene processes, and thin film transistor liquid crystal display (TFT-LCD) substrates and processes.

Photoresist 404 is disposed on the substrate 402. The photoresist 404 may be substantially similar to as described above with reference to block 306 of the method 300. In an embodiment, the photoresist 404 is chemical amplified photoresist (CAR). The photoresist 404 may be positive tone or negative tone resist. The photoresist 404 may include a polymer and a photoacid generator (PAG), which provides the solubility change to the developer. The photoresist 404 may be formed by processes such as coating (e.g., spin-on coating) and soft baking.

The photoresist 404 includes an irradiated (or exposed) region 404b. The exposure or irradiation may be substantially similar to block 308, described above with reference to FIG. 3. The region 404b may be provided by irradiation using ultraviolet (UV) radiation or extreme ultraviolet (EUV) radiation; additionally or alternatively include other radiation beams such as ion beam, x-ray, extreme ultraviolet, deep ultraviolet, and other proper radiation energy. Exemplary radiation is a 248 nm beam from a krypton fluoride (KrF) excimer laser, a 193 nm beam from an argon fluoride (ArF) excimer laser, and/or other suitable wavelength radiations. In an example, the photoresist 404b includes photo-acid generator (PAG) that has generated acid during the irradiation, thus changing the solubility of the 404b material as compared to the remainder of the photoresist 404. The region 404b may be defined by a photomask used in the lithography process.

The first and second BARC layers 406 and 408 interpose the substrate 402 and the overlying photoresist 404. In an embodiment, the BARC layer 406 is deposited and subsequently, the BARC layer 408 is deposited. For example, the BARC layer 406 may be formed using a spin-on coating process, a bake process performed, the BARC layer 408 formed using a spin-on coating process on the BARC layer 406, and an additional bake process performed. In an embodiment, there is substantially no mixing between the BARC layer 406 and the BARC layer 408 (at or after formation). In an embodiment, there is substantially no mixing between the photoresist layer 404 and the BARC layer 408 (at or after formation).

In an embodiment, BARC layer 406 is a developer-soluble bottom antireflective coating (DBARC). In an embodiment, BARC layer 408 is a developer-soluble bottom antireflective coating (DBARC). The BARC layer 406 and the BARC layer 408 may have different compositions. Exemplary compositions of the BARC layer 406 and/or the BARC layer 408 are discussed above with reference to block 304 of the method 300. The BARC layer 406 and the BARC layer 408 may have different dissolution properties (e.g., dissolution rates) in a developer solution. For example, BARC 408 may have a lower dissolution rate as compared to BARC 406. In an embodiment, BARC 408 has a weaker lateral etch rate; this may allow for a reduction in an undercut beneath the photoresist 404. The thickness of BARC layer 406 and BARC layer 408 in summation may between approximately 60 nm and approximately 80 nm. In an embodiment, the BARC layer 406 and/or the BARC layer 408 is approximately 30 nm.

Referring now to FIG. 5, illustrated is the device 400 of FIG. 4 after a developer is applied. The developer may be applied substantially similar to as discussed above with reference to block 310 of the method 300, illustrated in FIG. 3. After the developer removes the photoresist region 404b, the developer will contact the underlying BARC 408. The developer may then remove the uncovered BARC 408 as illustrated in FIG. 5, providing patterned BARC layer 504. Thereafter, the now-uncovered BARC 406 is removed, providing the patterned BARC layer 502. It is noted that the undercut profile under the patterned photoresist 404 (FIG. 5) is reduced. In an embodiment, the etch rate differential between the BARC layers allows for improved management of the profile. For example, providing BARC 408 with a lower dissolution rate may provide a reduction in the undercut provided by patterned BARC layer 504.

Referring now to the embodiments shown in FIGS. 6-7, illustrated is a device 600 having a substrate 402, a BARC layer 602, and an overlying photoresist layer 404. The substrate 402 and/or the photoresist 404 may be substantially similar to as described above with reference to FIG. 4 and/or to block 306 of the method 300. The photoresist 404 includes an irradiated (or exposed) region 404b. The exposure may be substantially similar to block 308, described above with reference to FIG. 3.

The BARC layer 602 is a single-layer. In an embodiment, the BARC layer 602 is a single layer of developer-soluble BARC material (DBARC). The BARC layer 602 may be deposited in a single process (e.g., spin-on coating). In an embodiment, after deposition, the composition of the BARC layer 602 provides for a separation of chemical compositions (e.g., polymers) such that the BARC layer 602 is non-uniform in composition. For example, in an embodiment, the top portion (e.g., nearest the photoresist 404) of the BARC layer 602 has a composition having a different dissolution rate in a developer than the bottom portion (e.g., nearer the substrate 402). In an embodiment, the top portion of the BARC layer 602 has a lower dissolution rate to a developer than the lower portion of the BARC layer 602. The varying dissolution rate may be provided by a first chemical component (e.g., polymer) moving or floating to the top portion of the BARC layer 602 after the coating is applied. The chemical component (e.g., polymer) may "float" on account of a different polarity than other compositions (e.g., polymers) of the layer, inclusion of fluorine atoms or fluorine units linked to the polymer, a different molecular weight than other compositions (e.g., polymers) of the layer, and/or other factors that may affect the affinity of chemical component in the BARC layer 602. Exemplary compositions and/or dissolution rates of the BARC layer 602 are discussed above with reference to block 304 of the method 300.

Referring now to FIG. 7, illustrated is the device 600 after developer is applied. The developer may be applied substantially similar to as discussed above with reference to block 310 of the method 300, illustrated in FIG. 3. After the developer removes the photoresist region 404b, the developer will contact the underlying BARC layer 602. The developer may then remove the uncovered BARC layer 602 forming the patterned BARC layer 702. It is noted that the undercut profile under the patterned photoresist 404 (FIG. 7) is reduced on account of the varying dissolution rate of the BARC layer 602. For example, a first or upper portion of the BARC layer 602 may provide a lower dissolution rate resulting in less lateral etching.

Referring now to the embodiments shown in FIGS. 8-9, illustrated is a device 800 having a substrate 402, a first bottom antireflective coating (BARC) 802, a second BARC layer 804, and an overlying photoresist layer 404. The substrate 402 and/or the photoresist 404 may be substantially similar to as described above with reference to FIG. 4 and/or to block 306 of the method 300. The photoresist 404 includes an irradiated (or exposed) region 404b. The exposure may be substantially similar to block 308, described above with reference to FIG. 3.

The first and second BARC layers 802 and 804 interpose the substrate 402 and the overlying photoresist 404. In an embodiment, the BARC layer 802 is deposited and subsequently and separately, the BARC layer 804 is deposited. For example, the BARC layer 802 may be formed using a spin-on coating process, followed by a bake process, and then the BARC layer 804 is formed on the BARC layer 802 using a spin-on coating process, and an additional bake process performed. In an embodiment, there is substantially no mixing between the BARC layer 802 and the BARC layer 804 (at or after formation). In an embodiment, there is substantially no mixing between the photoresist layer 404 and the BARC layer 804 (at or after formation). Exemplary compositions and/or dissolution rates of the BARC layers 802 and/or 804 are discussed above with reference to block 304 of the method 300.

In an embodiment, BARC layer 804 is a photosensitive BARC material. The photosensitive BARC layer 804 is soluble to a developer only in the regions where the material has been irradiated, for example, region 804b. In an embodiment, BARC layer 802 is a developer-soluble bottom antireflective coating (DBARC) (for example, being soluble in the developer without irradiation). The BARC layers 802 and 804 may have the same or different n, k values. The thickness of BARC layer 804 and BARC layer 802 in summation may between approximately 60 nm and approximately 80 nm. In an embodiment, the BARC layer 804 and/or the BARC layer 802 is approximately 30 nm.

Referring now to FIG. 9, illustrated is the device 800 after developer is applied. The developer may be applied substantially similar to as discussed above with reference to block 310 of the method 300, illustrated in FIG. 3. After the developer removes the photoresist region 404b, the developer will contact the underlying BARC layer 804. The developer may then remove the uncovered BARC layer 804. In an embodiment, the BARC layer 804 is a photosensitive BARC layer and the removal of the BARC material is constrained to the region of the layer that was irradiated—region 804b. Thus, the patterned BARC layer 904 is formed. Thereafter, the uncovered portion of the BARC layer 802 is removed. In an embodiment, the BARC layer 802 is developer-soluble BARC material. After dissolution of the uncovered BARC material, the patterned BARC layer 902 is provided. It is noted that the undercut profile under the patterned photoresist 404 (FIG. 9) is reduced. This reduction may be due to the first BARC layer 804 being photosensitive material thus removing only in the irradiated region allowing control of the sidewall profile, while the second BARC layer 802 can provide a dissolution rate in developer that allows control of its profile and/or a relative thickness that allows for reduced lateral etchings (e.g., a thinner layer relative to conventional embodiments can provide for less lateral etching component to the patterning).

Referring now to the embodiments shown in FIGS. 10-11, illustrated is a device 1000 having a substrate 402, a BARC layer 1002, and an overlying photoresist layer 404. The substrate 402 and/or the photoresist 404 may be substantially similar to as described above with reference to FIG. 4 and/or to block 306 of the method 300. The photoresist 404 includes an irradiated (or exposed) region 404b. The exposure may be substantially similar to block 308, described above with reference to FIG. 3.

The BARC layer 1002 may include a photosensitive BARC material and a developer soluble BARC material. The BARC layer 1002 may be deposited in a single process (e.g., spin-on coating). In an embodiment, after deposition and before irradiation, the BARC layer 1002 experiences a separation of chemical compositions (e.g., polymers) such that the BARC layer 1002 is non-uniform in composition. In an embodiment, the upper portion (e.g., nearest the photoresist 404) of the BARC layer 1002 has a composition having a different dissolution property in a developer than the bottom portion (e.g., nearer the substrate 402). In an embodiment, the top portion of the BARC layer 1002 includes photosensitive BARC material and the bottom portion of the BARC layer 1002 includes developer-soluble BARC material. Thus, in one embodiment, the irradiated region 1002b (being a photosensitive BARC material) has a solubility in a developer, while the remaining BARC material in the top portion of the BARC layer 1002 does not. The portion of the BARC material underlying the irradiated region 1002b may be developer-soluble ARC material (i.e., being soluble in developer without the requirement of irradiation). Exemplary compositions and/or dissolution rates of the BARC layer 1002 are discussed above with reference to block 304 of the method 300.

The varying dissolution properties of the BARC layer 1002 may be provided by a first chemical component moving or floating to the top portion of the BARC layer 1002. The first chemical component (e.g., polymer) may be a component of a photosensitive BARC material (e.g., include a PAG). The chemical component (e.g., polymer) may "float" on account of a different polarity than other compositions (e.g., polymers) of the layer, inclusion of fluorine atoms or fluorine units linked to the polymer, a different molecular weight than other compositions of the layer, and/or other factors that may affect the affinity of polymers in the BARC layer 1002.

Referring now to FIG. 11, illustrated is the device 1000 after a developer is applied. The developer may be applied substantially similar to as discussed above with reference to block 310 of the method 300, illustrated in FIG. 3. After the developer removes the photoresist region 404b, the developer will contact the underlying BARC layer 1002, and in particular the irradiated region of photosensitive BARC layer 1002b. Thereafter, the developer may continue to remove the uncovered BARC layer 1002 underlying the region 1002b, where the composition is developer-soluble. Thus, forming the patterned BARC layer 1102. It is noted that the undercut profile under the patterned photoresist 404 (FIG. 7) is reduced on account of the photosensitive upper portion of the BARC material. Meanwhile, the footing profile adjacent the substrate 402 is reduced on account of the developer soluble nature of the BARC material at the lower portion.

In summary, the methods and devices disclosed herein provide for compositions and methods of forming a bottom antireflective coating layer underlying a photoresist layer. In doing so, the present disclosure offers several advantages over prior art devices. Advantages of certain embodiments the present disclosure may include reduction in the footing and/or undercut provided in patterning the photoresist and underlying BARC layer. For example, by varying the dissolution properties of the BARC material from the interface with photoresist to the interface with the underlying substrate, a substantially straight-sidewall profile can be maintained. It is understood that different embodiments disclosed herein offer different disclosure, and that they may make various changes, substitutions and alterations herein without departing from the spirit and scope of the present disclosure.

Thus, provided in an embodiment is a method including providing a substrate and forming a bottom anti-reflective coating (BARC) on the substrate. The BARC includes a first portion overlying a second portion, which has a different composition than the first portion. The different composition may provide a different dissolution property of the BARC in a developer. A photoresist layer is formed on the first portion of the BARC. The photoresist layer is then irradiated and developed. The developing includes using a developer to remove a region of the photoresist layer and a region of the first and second portions of the BARC.

In some embodiments, BARC includes forming a single layer of BARC material. See FIGS. 6 and 10. In one embodiment, the first and second portions of the BARC are formed by separation of a first component and a second component in the single layer of BARC material. The separation is provided by at least one of difference in polarity of the first component and the second component, difference in molecular weight of the first component and the second component, and difference in fluorine atom quality in the first component and the second component. In an embodiment, the first portion includes a photosensitive bottom antireflective coating material, and the second portion includes a developer-soluble bottom antireflective coating material. In other embodiments, the first and second portions of developer-soluble BARC material having different dissolution rates in a developer.

In other embodiments, the first portion of the BARC is a first layer and the second portion of the BARC is a separate second layer. For example, the first layer may be formed using a first spin-on coating process and a first bake process, the second layer may be formed using a second spin-on coating process and a second bake process. In one embodiment, the first layer includes a photosensitive bottom antireflective coating material and the second layer includes a developer-soluble bottom antireflective coating material different than the photosensitive bottom antireflective coating material. In another embodiment, the first portion of the BARC has a different dissolution rate than the second portion of the BARC in the developer.

In another embodiment, a method is described including providing a semiconductor substrate and forming a first bottom anti-reflective coating (BARC) layer on the semiconductor substrate. Thereafter, a second bottom anti-reflective coating (BARC) layer is formed directly on the first BARC layer. The first and second BARC layers have a different composition. A photoresist layer is formed on the second BARC.

In a further embodiment, the first BARC layer may be a photosensitive layer. The second BARC layer may be a developer-soluble layer. In other embodiments, the first BARC layer and the second BARC layer are developer-soluble layers having different dissolution rates in a developer. A thickness of the first BARC layer plus a thickness of the second BARC layer is between approximately 60 nanometers (nm) and approximately 80 nm.

In yet another embodiment, a method of forming a coating is described which includes forming a coating on a substrate; and separating the coating into a first portion and an underlying second portion. The separating is performed by floating a first polymer to a top surface of the first portion. The first polymer may float due to the presence of fluorine atoms, a difference in molecular weight, a difference in polarity, and/or other physical property. The separation may provide a top portion that includes a polymer with a higher percentage of fluorine than that of the second portion.

What is claimed is:

1. A method, comprising:
providing a substrate;
forming a developer-soluble bottom anti-reflective coating (BARC) on the substrate, wherein the developer-soluble BARC includes a first portion overlying a second portion, wherein the first portion includes a non-photosensitive material having a first dissolution rate in a developer and the second portion includes a non-photosensitive material having a second dissolution rate in the developer, the second dissolution rate being greater than the first dissolution rate;
forming a photoresist layer on the first portion of the BARC;
irradiating the photoresist layer; and
developing the photoresist layer, wherein the developing includes using a developer to remove a region of the photoresist layer and a region of the first and second portions of the BARC.

2. The method of claim 1, wherein the forming the developer-soluble BARC includes forming a single layer of BARC material.

3. The method of claim 2, wherein the first and second portions of the BARC are formed by separation of a first component and a second component in the single layer of BARC material.

4. The method of claim 3, wherein the separation is provided by at least one of difference in polarity of the first component and the second component, difference in molecular weight of the first component and the second component, and difference in fluorine atom quantity in the first component and the second component.

5. The method of claim 1, wherein the forming the BARC includes forming a first layer providing the first portion and forming a second layer providing the second portion.

6. The method of claim 5, wherein the forming the first layer includes performing a first spin-on coating process and a first bake process, and wherein the forming the second layer includes performing a second spin-on coating process and a second bake process.

7. The method of claim 1, wherein the first portion and the second portion include different concentrations of lactone functional groups.

8. The method of claim 1, wherein the first portion includes a polymer having approximately 20% lactone functional units.

9. The method of claim 8, wherein the second portion includes the polymer having approximately 30% lactone functional units.

10. The method of claim 8, further comprising:
providing fluorine groups attached to the polymer.

11. The method of claim 1, further comprising:
opening a lower number of rings of lactone functional group in the first portion than in the second portion when contacted by the developer.

12. The method of claim 1, wherein the second dissolution rate is approximately 1.1 times the first dissolution rate.

13. A method, comprising:
providing a semiconductor substrate;
forming a first bottom developer-soluble anti-reflective coating (BARC) layer on the semiconductor substrate, wherein the first BARC layer is non-photosensitive material;
thereafter, forming a second developer-soluble bottom anti-reflective coating (BARC) layer directly on the first developer-soluble BARC layer, wherein the second BARC layer is non-photosensitive material and wherein the first and second BARC layers have a different dissolution rate in a developer; and
forming a photoresist layer on the second developer-soluble BARC.

14. The method of claim 13, wherein a thickness of the first BARC layer plus a thickness of the second BARC layer is between approximately 60 nanometers (nm) and approximately 80 nm.

15. The method of claim 13, wherein the first and second dissolution rate are provided in non-irradiated regions of the BARC.

16. A method of forming a coating, comprising:
forming a non-photosensitive coating on a substrate;
separating the coating into a first developer-soluble portion and an underlying second developer-soluble portion, wherein the separating is performed by floating a first polymer to a top surface of the first portion;
applying the developer to the coating;
using the developer to dissolve the first portion at a first dissolution rate; and
using the developer to dissolve the second portion at a second dissolution rate, the second dissolution rate being greater than the first dissolution rate.

17. The method of claim 16, wherein the first portion includes a polymer with a higher percentage of fluorine than that of the second portion, and wherein the fluorine causes the separating of the coating.

* * * * *